(12) United States Patent
Kawabata

(10) Patent No.: US 8,579,128 B2
(45) Date of Patent: Nov. 12, 2013

(54) GRIPPER DEVICE FOR TRANSPORT VEHICLE, TRANSPORT VEHICLE AND OVERHEAD HOIST TRANSPORT VEHICLE

(75) Inventor: Masayasu Kawabata, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 169 days.

(21) Appl. No.: 13/170,553

(22) Filed: Jun. 28, 2011

(65) Prior Publication Data

US 2012/0000875 A1 Jan. 5, 2012

(30) Foreign Application Priority Data

Jul. 2, 2010 (JP) .................................. 2010-152414
Jul. 2, 2010 (JP) .................................. 2010-152415

(51) Int. Cl.
B66C 19/00 (2006.01)

(52) U.S. Cl.
USPC ............................ 212/332; 212/327; 212/330

(58) Field of Classification Search
USPC ......... 212/326, 327, 242, 251, 259, 271, 330, 212/332; 294/119.1, 207; 414/281, 749.1, 414/751.1, 940
See application file for complete search history.

(56) References Cited

U.S. PATENT DOCUMENTS

| | | | |
|---|---|---|---|
| 6,840,736 B2 * | 1/2005 | Ohtachi et al. .................. | 415/90 |
| 6,889,813 B1 * | 5/2005 | Trammell et al. .......... | 198/346.3 |
| 7,328,812 B2 | 2/2008 | Nakao et al. | |
| 7,464,823 B2 * | 12/2008 | Nakao et al. .................. | 212/274 |
| 7,611,023 B2 | 11/2009 | Ito | |
| 2005/0173446 A1 * | 8/2005 | Han et al. ......................... | 221/15 |
| 2006/0182603 A1 * | 8/2006 | Hawes ........................... | 414/735 |
| 2010/0225131 A1 * | 9/2010 | Weber ......................... | 294/67.33 |

FOREIGN PATENT DOCUMENTS

| | | |
|---|---|---|
| JP | 03-113385 U | 11/1991 |
| JP | 04-023284 U | 2/1992 |
| JP | 05-162095 A | 6/1993 |
| JP | 06-008381 U | 2/1994 |
| JP | 06-127888 A | 5/1994 |
| JP | 07-060680 A | 3/1995 |
| JP | 2000-012644 A | 1/2000 |
| JP | 2001-163447 A | 6/2001 |
| JP | 2001-294390 A | 10/2001 |
| JP | 2002-283270 A | 10/2002 |
| JP | 2003-025999 A | 1/2003 |
| JP | 2003-165687 A | 6/2003 |
| JP | 2005-194009 A | 7/2005 |
| JP | 2006-008354 A | 1/2006 |
| JP | 2006-013396 A | 1/2006 |
| JP | 2006-076748 A | 3/2006 |
| JP | 2006-103879 A | 4/2006 |
| JP | 2006-298535 A | 11/2006 |
| JP | 2009-176765 A | 8/2009 |

* cited by examiner

*Primary Examiner* — Emmanuel M Marcelo
*Assistant Examiner* — Angela Caligiuri
(74) *Attorney, Agent, or Firm* — Keating & Bennett, LLP

(57) ABSTRACT

A gripper device for a transport vehicle includes a base plate, a guide rail provided on an upper surface of the base plate, a pair of guide blocks arranged to be movable in a substantially horizontal direction toward and away from each other along the guide rail, and a pair of gripping parts. Each of the gripping parts includes a horizontal portion fixed to an upper surface of one of the guide blocks and arranged to extend substantially parallel to the upper surface of the base plate, a vertical portion arranged to extend downward from the horizontal portion to a position lower than that of the base plate, and a claw section provided on a lower end of the vertical portion and arranged to grip an object.

16 Claims, 9 Drawing Sheets

GRIPPER DEVICE FOR TRANSPORT VEHICLE, TRANSPORT VEHICLE AND OVERHEAD HOIST TRANSPORT VEHICLE

CROSS-REFERENCE TO RELATED APPLICATIONS

This application claims priority under 35 U.S.C. §119 to Japanese Patent Application No. 2010-152414 filed on Jul. 2, 2010 and Japanese Patent Application No. 2010-152415 filed on Jul. 2, 2010. The entire disclosure of Japanese Patent Application Nos. 2010-152414 and 2010-152415 are hereby incorporated herein by reference.

BACKGROUND OF THE INVENTION

1. Field of the Invention

The present invention relates to a gripper device for a transport vehicle that is provided on an OHT (overhead hoist transport) or other transport vehicles to convey an object, e.g., a FOUP (front opening unified pod), in a suspended state and serves to hold the object. The present invention also relates to a transport vehicle and an overhead hoist transport vehicle.

2. Description of the Related Art

A transport vehicle gripper device for holding an upper portion (e.g., a flange) of a FOUP or other objects with a pair of gripping parts that can be opened and closed is known (e.g., Japanese Laid-open Patent Publication No. 2001-294390). Japanese Laid-open Patent Publication No. 2001-294390, for example, discloses a gripper device in which a guide rail is fixed to a bottom surface (or an under surface) of a top panel portion and a gripping part is attached from below to each of a pair of guide blocks mounted to the guide rail. Each of the gripping parts includes a support plate, a finger support plate, and a finger, arranged in order from bottom to top.

Also known is an overhead hoist transport (OHT) vehicle (e.g., Japanese Laid-open Patent Publication No. 2006-298535 and Japanese Laid-open Patent Publication No. 2006-8354) having a hoist table that can be raised and lowered by a hoist drive section and a pair of chuck parts of the gripping parts provided on the hoist table. The chuck parts are arranged to grip an upper portion (e.g., a flange) of a FOUP or other objects. Regarding this kind of overhead hoist transport vehicle, various techniques have been proposed for preventing the conveyed object from vibrating while the vehicle is moving. Japanese Laid-open Patent Publication No. 2006-298535 presents a technique in which an elastic member is provided between the hoist drive section and the hoist table to prevent vibrations of the overhead hoist transport vehicle from being transmitted to the object. Japanese Laid-open Patent Publication No. 2006-8354 presents a technique in which a pressing means for pressing the object downward from above is provided on the hoist table, and the object is prevented from vibrating while the overhead hoist transport vehicle is moving by adjusting a height position of the hoist table and thereby adjusting a pressing force of the pressing means.

For example, in a conventional configuration disclosed in the above-mentioned Japanese Laid-open Patent Publication No. 2001-294390, the guide rail is provided on the bottom surface of the top panel portion, and the guide rail is commonly fixed to the bottom surface of the top panel portion with screws. However, such a conventional configuration has a technical problem in which, due to the weight of an object or vibrations occurring during conveyance of the object or the like, the screws may be damaged or loosened. Consequently, proper maintenance and repairs are required to prevent the object from falling. A reduction in the time and energy for such maintenance procedures is thus desired.

In addition, the above-mentioned conventional overhead hoist transport vehicle, for the purpose of lowering power consumption, commonly stops power feeding to a drive section such as a motor, which drives the pair of chuck parts of the gripping part, when the overhead hoist transport vehicle is conveying the object while gripping the object. When the power feeding to the drive section is stopped, gripping power of the pair of chuck parts decreases, which may result in the falling of the object. Consequently, the overhead hoist transport vehicle has a technical problem in which a device for preventing the object from falling, such as an opening preventing device for preventing the pair of chuck parts from opening, needs to be additionally provided on the gripping part. As a result, the weight of the gripping part would increase and the structure of the same would become complex, which results in a cost increase.

SUMMARY OF THE INVENTION

Preferred embodiments of the present invention provide a gripper device for a transport vehicle which lessens the need for repair and maintenance that are required to prevent an object from falling, and provide a transport vehicle including a gripper device that solves the above-mentioned problems.

In addition, preferred embodiments of the present invention provide an overhead hoist transport vehicle with a simple structure to prevent a pair of chuck parts from opening during conveyance of an object so as to solve the above-mentioned problems.

A gripper device for a transport vehicle according to a preferred embodiment of the present invention is preferably provided on a transport vehicle that conveys an object in a suspended state and serves to hold the object. In order to solve the problems explained above, the gripper device for the transport vehicle according to a preferred embodiment of the present invention preferably includes a base plate, a guide rail, a pair of guide blocks, and a pair of gripping parts. The guide rail is provided on an upper surface of the base plate. The two guide blocks are provided on the guide rail and arranged to be movable toward and away from each other along the rail in a substantially horizontal direction. The pair of gripping parts are fixed to an upper surface of the guide blocks and each includes a horizontal portion arranged to extend substantially parallel to the upper surface of the base plate, a vertical portion arranged to extend downward from the horizontal portion to a position lower than that of the base plate, and a claw section provided on a lower end of the vertical portion and arranged to grip an object.

An overhead hoist transport vehicle according to a preferred embodiment of the present invention is arranged to travel along a path on a ceiling and to convey an object. In order to solve the problems explained above, the overhead hoist transport vehicle includes a hand section arranged to grip an object and a hoist section. The hand section includes a base plate, a guide rail provided on the base plate, a pair of chuck parts arranged to be movable in a substantially horizontal direction toward and away from each other along the guide rail and including claw sections arranged to grip an object, and a cushion member that includes an elastic member and is provided on the chuck parts. The hoist section raises and lowers the hand section up and down, and is arranged to contact and apply pressure to the cushion member when the hand section is raised, such that movement of the chuck parts is restricted by a friction force generated between the chuck parts and the hoist section.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be explained with reference to the drawings.

First Preferred Embodiment

A gripper device according to a first preferred embodiment of the present invention will now be explained with reference to FIGS. 1 to 4.

The overall configuration of a transport vehicle equipped with a gripper device according to the first preferred embodiment will be explained first with reference to FIG. 1.

Figure 1:
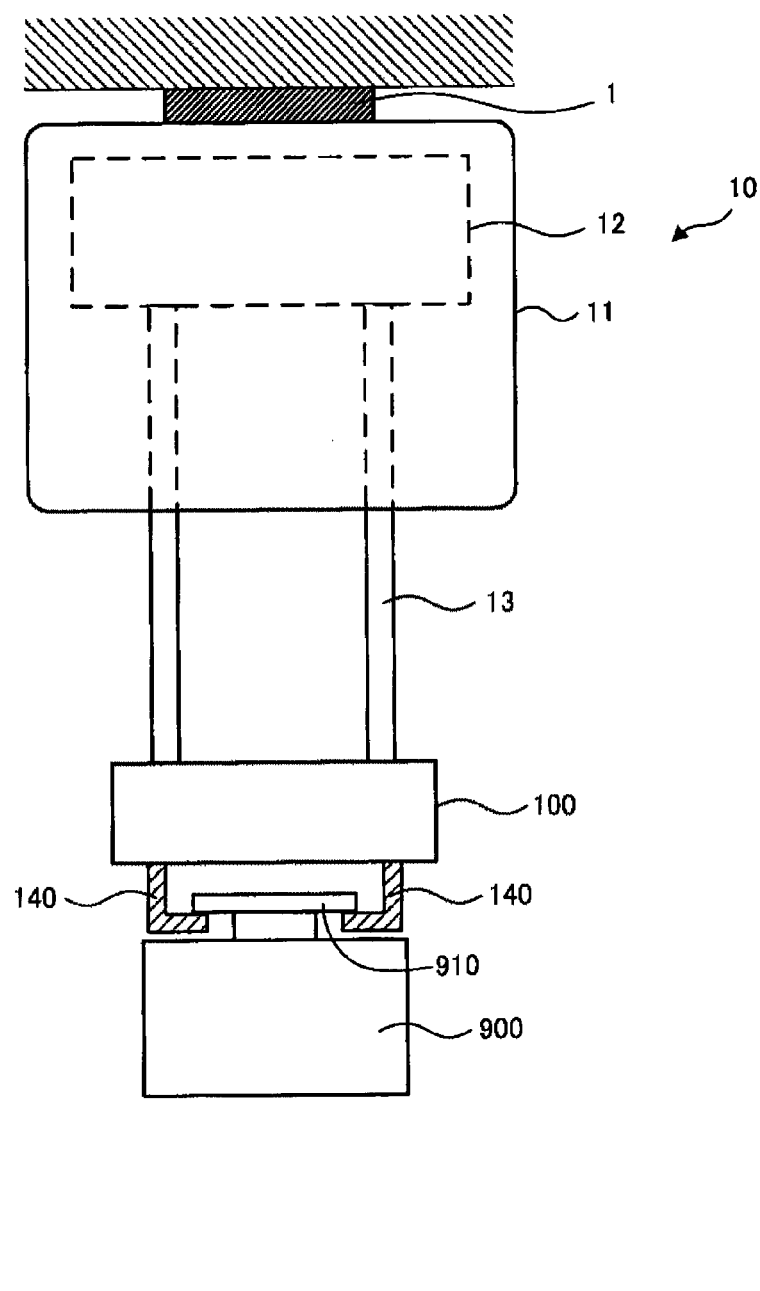
FIG. 1 is a side view showing an overall configuration of a transport vehicle equipped with a gripper device according to a first preferred embodiment of the present invention.

FIG. 1 is a side view showing the overall configuration of a transport vehicle equipped with a gripper device according to the first preferred embodiment.

The transport vehicle 10 shown in FIG. 1 is an overhead hoist transport (OHT) vehicle preferably arranged to travel along a path 1 provided on a ceiling of a semiconductor manufacturing plant or other facilities and carry a suspended FOUP 900 containing semiconductor wafers and the like, for example. The overhead hoist transport vehicle is an example of a "transport vehicle." The FOUP 900 is an example of an "object" to be conveyed.

The transport vehicle 10 includes a traveling section 11, a hoist section 12 provided inside the traveling section 11, a belt 13, and a gripper device 100.

The gripper device 100 is an example of a "gripper device for a transport vehicle." The gripper device 100 is provided on the transport vehicle 10 (which is arranged to travel along the path 1 provided on the ceiling of a semiconductor manufacturing plant or other facilities, for example) and is arranged to grip an upper portion (e.g., a flange) of an object, e.g., a FOUP 900, with a pair of gripping parts including, for example, chucks or fingers. The pair of gripping parts grips the object such that the transport vehicle 10 can carry the object in a suspended state.

The hoist section 12 is an example of a "hoist device."

The traveling section 11 is attached to the path 1 in a suspended fashion and arranged to be driven by a linear motor such that it travels along the path 1.

The hoist section 12 is arranged to move the gripper device 100 up and down. The hoist section 12 is provided inside the traveling section 11 and is connected to the gripper device 100 through a belt 13 such that it can raise and lower the gripper device 100. More specifically, the hoist section 12 has a winding shaft, to which one end of the belt 13 is fixed, and a motor arranged to rotate the winding shaft. When the motor rotates the winding shaft of the hoist section 12, the belt 13 is wound in or wound out at the aforementioned one end such that the gripper device 100 (more specifically, the base plate 110 mentioned later with reference to FIG. 2) fixed to the other end of the belt 13 is raised or lowered.

The gripper device 100 serves to grip the FOUP 900 and includes a pair of chucks 140 exemplifying a "pair of gripping parts." The gripper device 100 is preferably constructed such that it can hold a FOUP 900 by gripping an upper flange 910 of the FOUP 900 with the pair of chucks 140.

A gripper device according to the first preferred embodiment will now be explained with reference to FIGS. 2 to 4.

Figure 2:
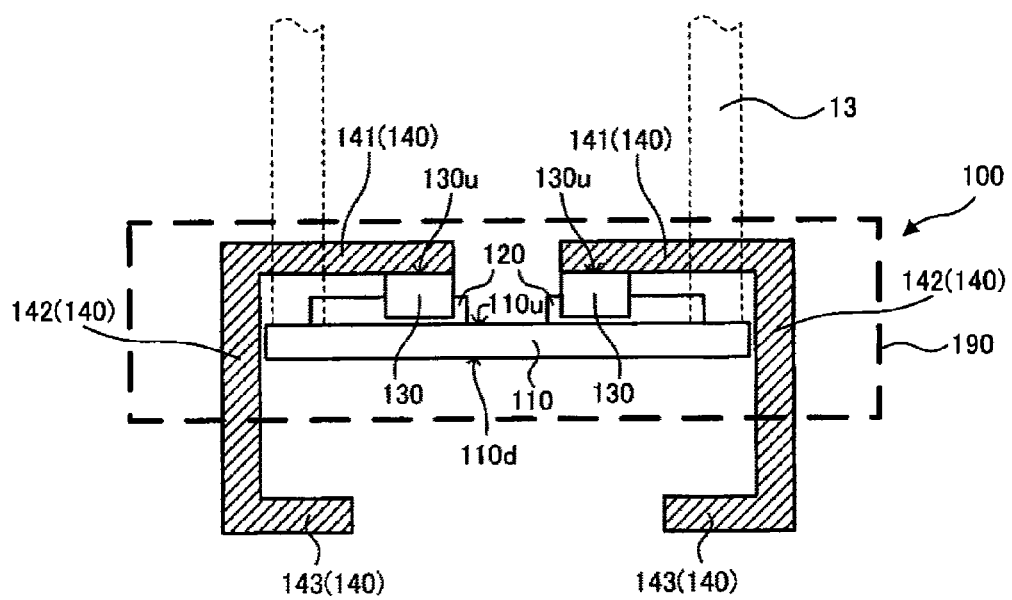
FIG. 2 is a cross sectional view showing constituent features of the gripper device according to the first preferred embodiment (in a gripped state).
Figure 3:
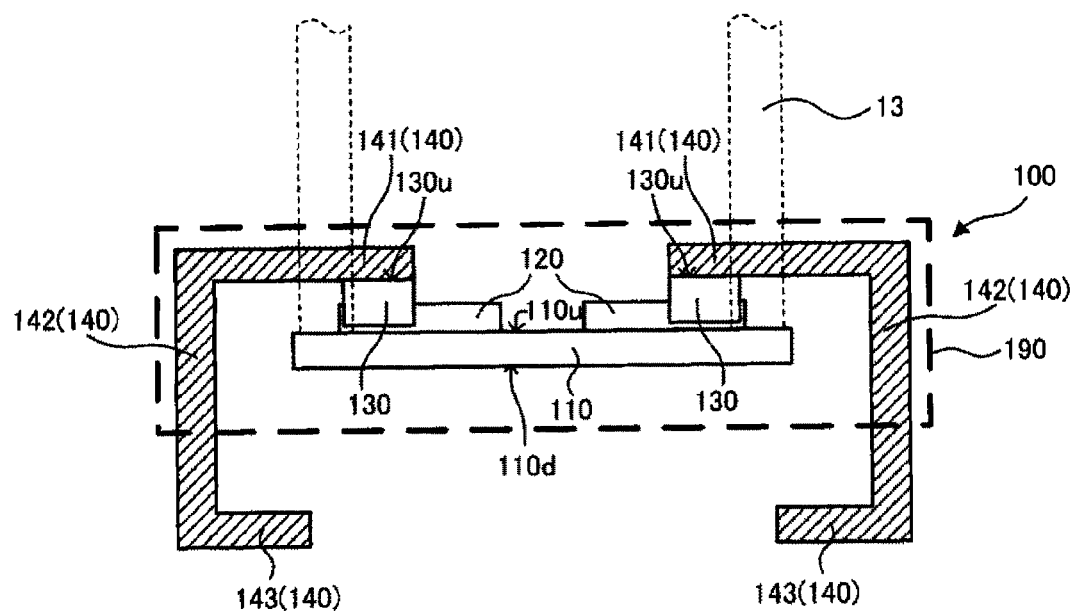
FIG. 3 is a cross sectional view showing constituent features of the gripper device according to the first preferred embodiment (in a released state).

FIGS. 2 and 3 are cross sectional views showing constituent features of the gripper device according to the first preferred embodiment. FIG. 4 is a perspective view showing constituent features of the gripper device according to the first preferred embodiment. FIGS. 2 and 3 are cross sectional views taken along a section line that extends in a direction parallel to a direction in which a guide rail 120 extends and slices the gripper device 100 such that the cross section includes the guide rail 120, a pair of guide blocks 130, and the pair of chucks 140. FIG. 2 shows the pair of chucks 140 in a gripped state. FIG. 3 shows the pair of chucks 140 in a released state. FIG. 4 is a perspective view of the gripper device 100 as seen from diagonally above. FIG. 4 omits a case 190 shown in FIGS. 2 and 3.

Figure 4:
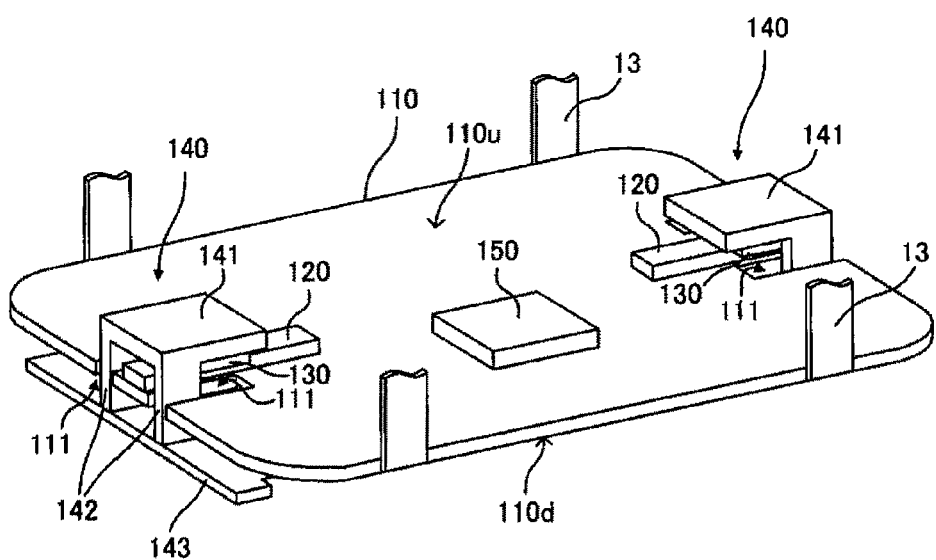
FIG. 4 is a perspective view showing constituent features of the gripper device according to the first preferred embodiment.

As shown in FIGS. 2 to 4, the gripper device 100 preferably includes a base plate 110, the guide rail 120, the pair of guide blocks 130, the pair of chucks 140, and the case 190. The guide rail 120 is provided on an upper surface 110$u$ of the base plate 110; the two guide blocks 130 are moveably engaged with the guide rail 120; the two chucks 140 are respectively fixed to the two guide blocks 130; and the case 190 houses these and other components of the gripper device 100.

The base plate 110 is a flat plate-shaped member connected to the hoist section 12 through the belt 13. The base plate 110 is raised and lowered in a vertical direction (plumb direction indicated as Z-direction in the figures) when the hoist section 12 winds the belt 13 in and out. As will be explained later, in the first preferred embodiment, a pair of through grooves 111 (see FIG. 4) is provided in the base plate 110 at two sides of the guide rail 120.

The guide rail 120 is made of, for example, metal, and is arranged such that it extends in one direction (X-direction in the figures) along the upper surface 110$u$ of the base plate 110. The pair of guide blocks 130 (explained later) are moveably engaged with the guide rail 120. The guide rail 120 has a portion configured to engage with one of the two guide blocks 130 and a portion configured to engage with the other of the two guide blocks 130.

The pair of guide blocks 130 preferably are block-shaped members made of, for example, metal, and are configured to engage moveably with the guide rail 120. The pair of guide blocks 130 are moveably provided on the guide rail 120, which is provided on the base plate 110. The guide blocks 130 are movable along the guide rail 120 when driven by a drive section 150 (see FIG. 4) that is provided on the upper surface 110u of the base plate 110 and includes, for example, a motor.

The two chucks 140 are respectively fixed onto the two guide blocks 130 such that the pair of chucks 140 can be made to grip a flange 910 of the FOUP 900 by moving the pair of guide blocks 130 closer together along the guide rail 120 so as to achieve a gripped state (i.e., the state shown in FIG. 2). By moving the guide blocks 130 away from each other along the guide rail 120, a released state can be achieved in which the flange 910 of the FOUP 900 is released (i.e., the state shown in FIG. 3).

Each of the two chucks 140 is fixed to an upper surface 130u of the respective guide block 130 and has a horizontal portion 141, a vertical portion 142, and a claw section 143. The horizontal portion 141 extends substantially parallel to the upper surface 110u of the base plate 110. The vertical portion 142 extends downward from the horizontal portion 141 to a position lower than that of the base plate 110. The claw section 143 extends from a bottom end of the vertical portion 142 toward the middle of the base plate 110. Collectively, the horizontal portions 141, the vertical portions 142, and the claw sections 143 make the pair of chucks 140 generally C-shaped or U-shaped in a cross sectional view. As shown in FIG. 4, the vertical portion 142 includes a pair of plate-shaped members that are movable within the pair of through grooves 111 located in the base plate 110 on the two sides of the guide rail 120.

In the gripper device 100, the guide rail 120 and the pair of guide blocks 130 are provided on the upper surface 110u of the base plate 110. Also, each of the two chucks 140 is fixed to the upper surface of the respective guide block 130 and includes the horizontal portion 141 that extends substantially parallel to the upper surface 110u of the base plate 110, the vertical portion 142 that extends downward from the horizontal portion 141 to a position lower than that of the base plate 110, and the claw section 143 provided on a lower end of the vertical portion 142 and arranged to grip the FOUP 900.

With this gripper device 100, the guide rail 120 and the pair of guide blocks 130 are provided on the upper surface 110u of the base plate 110. Therefore, the need for repairs and maintenance that are required to prevent the FOUP 900 from falling are lessened in comparison with, for example, a device in which the guide rail 120 and the pair of guide blocks 130 are fixed to a bottom surface 110d of the base plate 110 with screws.

Additionally, with this gripper device 100, when the flange 910 of the FOUP 900 is gripped with the pair of chucks 140 and the FOUP 900 is in a suspended state, the falling of the FOUP 900 due to the weight of the FOUP 900 or vibrations occurred during conveyance of the FOUP 900 can be reliably prevented. For example, the falling of the FOUP 900 due to detachment of the guide rail 120 from the base plate 110, detachment of a guide block 130 from the guide rail 120, or detachment of a chuck 140 from a guide block 130, can be reliably prevented. As a result, the device may be more fail-safe.

In other words, in the first preferred embodiment, the guide rail 120 and the pair of guide blocks 130 are preferably provided on the upper surface 110u of the base plate 110. Each of the chucks 140 is fixed to the upper surface 130u of one of the guide blocks 130. Therefore, when the flange 910 of the FOUP 900 is gripped with the pair of chucks 140 and the FOUP 900 is in a suspended state, a force corresponding to the weight of the FOUP 900 acts on the upper surface of the guide rail 120 through the chucks 140 and the guide blocks 130 and is transferred through the guide rail 120 to the base plate 110. The force corresponding to the weight of the FOUP 900 acts on the upper surface 130u of the guide blocks 130 through the chucks 140 and is transferred toward the guide rail 120 through the guide blocks 130. As a result, the guide rail 120 can be reliably deterred or prevented from detaching from the base plate 110 and the guide block 130 can be reliably deterred or prevented from detaching from the guide rail 120 due to the weight of the FOUP 900. Conversely, if no such countermeasure were adopted, i.e., if the guide rail 120 was fixed to the bottom surface 110d of the base plate 110 and the chucks 140 were fixed to the bottom surfaces of the guide blocks 130 moveably engaged with the guide rails 120, the force corresponding to the weight of the FOUP 900 would act on the guide rail 120 so as to separate the guide rail 120 from the base plate 110 and the force corresponding to the weight of the FOUP 900 would act on the guide blocks 130 so as to separate the guide blocks 130 from the guide rail 120. Consequently, the FOUP 900 would be at risk of falling. The FOUP 900 is particularly likely to fall when the FOUP 900 is heavy and when connections between parts have become weakened, e.g., when screws fixing the guide rail 120 to the base plate 110 have become loose.

Additionally, with the first preferred embodiment, since each of the chucks 140 includes a horizontal portion 141 that is fixed to the upper surface 130u of the respective guide block 130, when the flange 910 of the FOUP 900 is gripped by the pair of chucks 140 and the FOUP 900 is in a suspended state, a force corresponding to the weight of the FOUP 900 acts on the horizontal portions 141 through the claw sections 143 and the vertical portions 142 and presses the horizontal portions 141 against the guide blocks 130. Thus, the chucks 140 can be deterred or prevented from detaching from the guide blocks 130 due to the weight of the FOUP 900.

As explained above, with the gripper device 100 according to the first preferred embodiment, the need for repairs and maintenance that are required to prevent the FOUP 900 from falling are lessened. As a result, the device may be more fail-safe.

Additionally, in the first preferred embodiment, the base plate 110 includes a pair of through grooves 111 that are provided on two sides of the guide rail 120 and are configured to extend in the direction in which the guide rail 120 extends. The vertical portion 142 of each of the two chucks 140 includes a pair of plate-shaped members that are movable within the pair of through grooves 111 along the direction in which the guide rail 120 extends. Since the vertical portion 142 of each of the chucks 140 includes a pair of plate-shaped members, the chucks 140 can be made smaller, lighter in weight, and stronger.

Additionally, with the first preferred embodiment, the gripper device 100 can be made smaller because, as explained previously, the drive section 150 that drives the guide blocks 130 is provided on the upper surface 110u of the base plate 110, similarly to the guide rail 120 and the pair of guide blocks 130.

Second Preferred Embodiment

An overhead hoist transport (OHT) vehicle according to a second preferred embodiment of the present invention will now be explained with reference to FIGS. 5 to 9.

The overall configuration of an overhead hoist transport vehicle according to the second preferred embodiment will be explained first with reference to FIG. 5.

Figure 5:
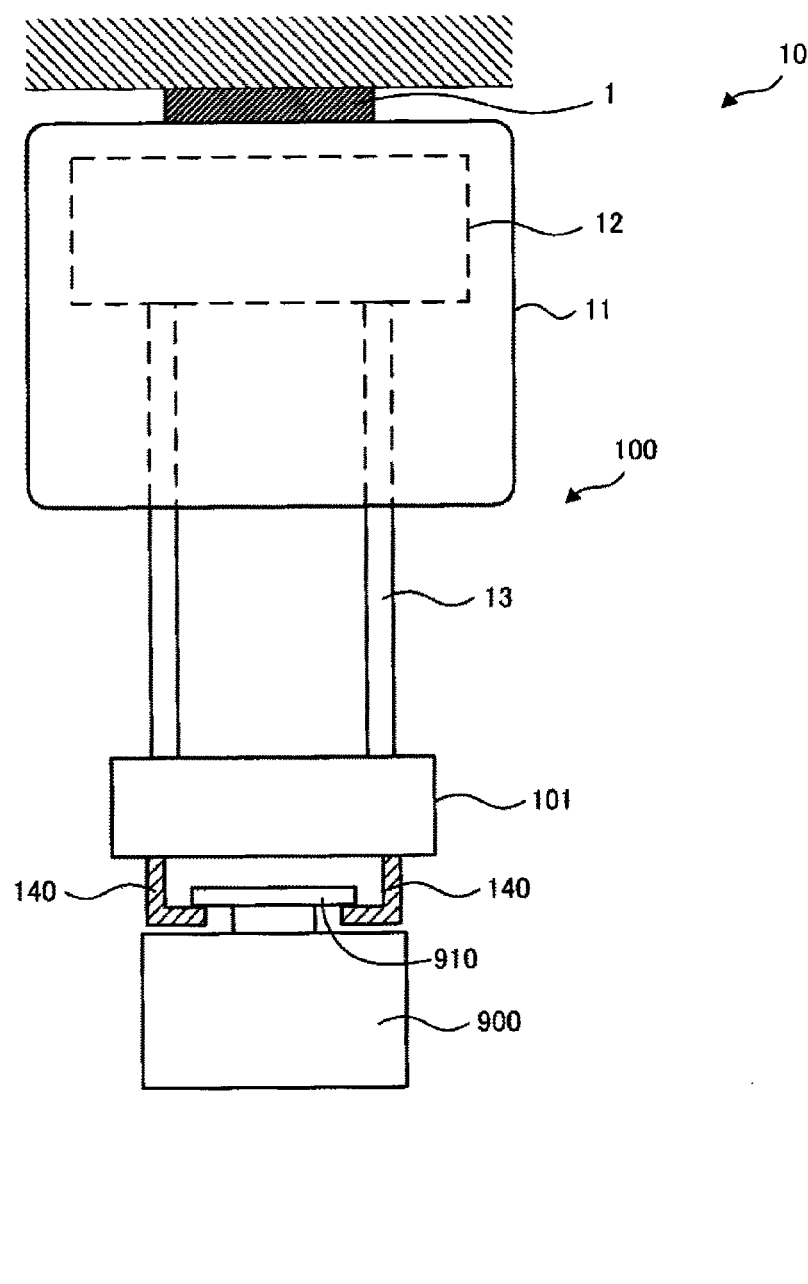
FIG. 5 is a side view showing an overall configuration of an overhead hoist transport vehicle according to a second preferred embodiment of the present invention.

FIG. 5 is a side view showing an overall configuration of an overhead hoist transport vehicle according to the second preferred embodiment.

The overhead hoist transport vehicle 10 shown in FIG. 5 preferably is an overhead hoist transport (OHT) vehicle arranged to travel along a path 1 provided on a ceiling of a semiconductor manufacturing plant or other facilities and carry a suspended FOUP 900 containing semiconductor wafers and the like, for example. The overhead hoist transport vehicle 10 is arranged to grip an upper portion (e.g., a flange) of an object, e.g., a FOUP, with a hand section. As explained previously, the overhead hoist transport vehicle 10 includes a hoist section arranged to move the hand section up and down and, when conveying an object, the overhead hoist transport vehicle 10 is arranged to travel with the hand section in a raised state while the hand section grips the object. The FOUP 900 is an example of an "object" to be conveyed.

The overhead hoist transport vehicle 10 is provided with a traveling section 11 and a gripper device 100 of which a portion is fixed to the traveling section 11.

The traveling section 11 is attached to the path 1 in a suspended fashion and arranged to be driven by a linear motor such that it travels along the path 1.

The gripper device 100 serves to grip the FOUP 900 and includes a hoist section 12 and a hand section 101 connected to the hoist section 12 through a belt 13.

The hoist section 12 is provided inside the traveling section 11 and is connected to the hand section 101 through the belt 13 such that it can raise and lower (wind up and wind down) the hand section 101. More specifically, the hoist section 12 includes a winding shaft, to which one end of the belt 13 is fixed, and a motor arranged to rotate the winding shaft. When the motor rotates the winding shaft of the hoist section 12, the belt 13 is wound in or wound out at the aforementioned one end such that the hand section 101 (more specifically, the base plate 110 mentioned later with reference to FIG. 6) fixed to the other end of the belt 13 is raised or lowered.

The hand section 101 is provided with a pair of chucks 140 exemplifying a "pair of gripping parts." The hand section 101 is arranged such that it can hold the FOUP 900 by gripping an upper flange 910 of the FOUP 900 with the pair of chucks 140. The hand section 101 includes a base plate 110, a guide rail 120, and the pair of chucks 140. In the second preferred embodiment, the hand section 101 further includes a pair of guide blocks 130 and a cushion member 160 that includes an elastic member as will be explained later.

Constituent features of the hand section 101 of the overhead hoist transport vehicle according to the second preferred embodiment will now be explained with reference to FIGS. 6 to 8.

Figure 6:
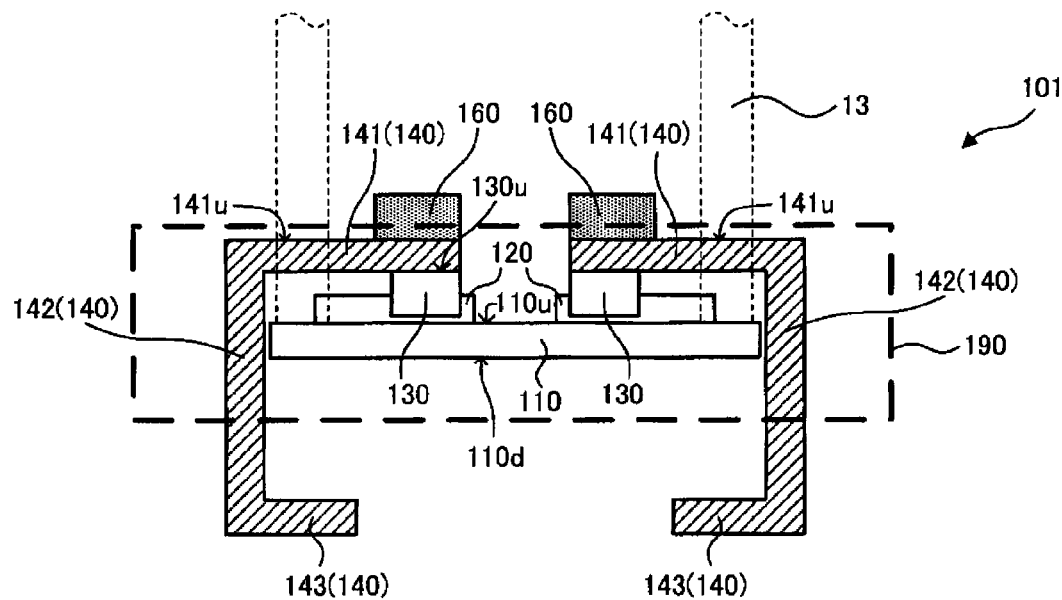
FIG. 6 is a cross sectional view showing constituent features of a hand section of the overhead hoist transport vehicle according to the second preferred embodiment (in a gripped state).
Figure 6:
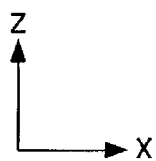
Figure 7:
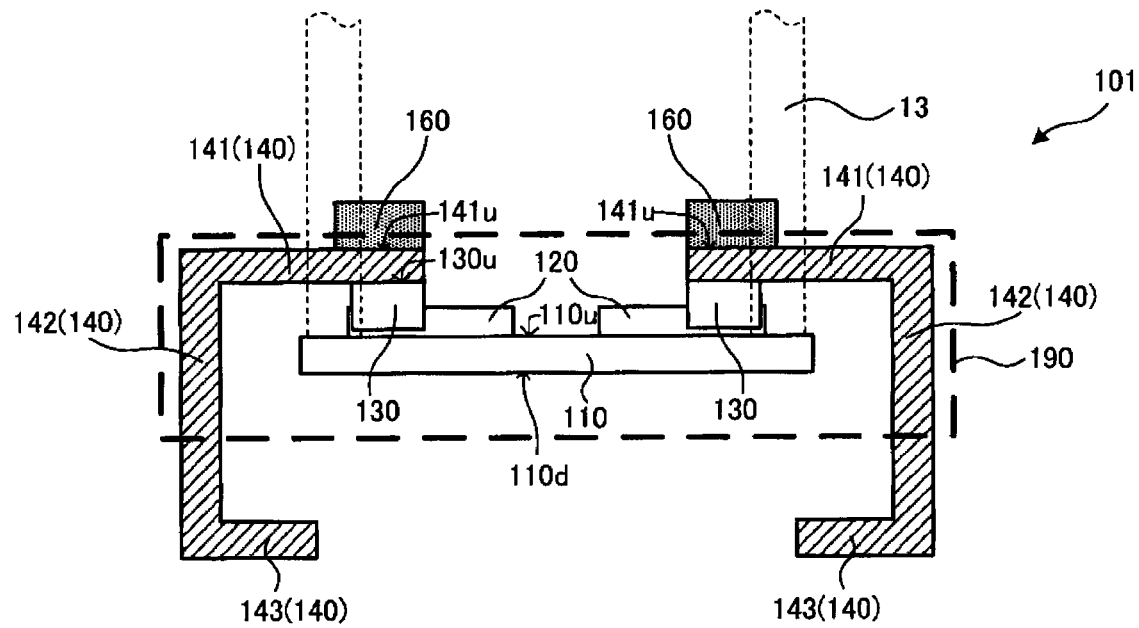
FIG. 7 is a cross sectional view showing constituent features of the hand section of the overhead hoist transport vehicle according to the second preferred embodiment (in a released state).

FIGS. 6 and 7 are cross sectional views showing constituent features of a hand section of the overhead hoist transport vehicle according to the second preferred embodiment. FIG. 8 is a perspective view showing constituent features of the hand section of the overhead hoist transport vehicle according to the second preferred embodiment. FIGS. 6 and 7 are cross sectional views taken along a section line that extends in a direction parallel to a direction in which the guide rail 120 extends and slices the hand section 101 such that the cross section includes the guide rail 120, the pair of guide blocks 130, and the pair of chucks 140. FIG. 6 shows the pair of chucks 140 in a gripped state, and FIG. 7 shows the pair of chucks 140 in a released state. FIG. 8 is a perspective view of the hand section 101 as seen from diagonally above. FIG. 8 omits the case 190 shown in FIGS. 6 and 7.

Figure 8:
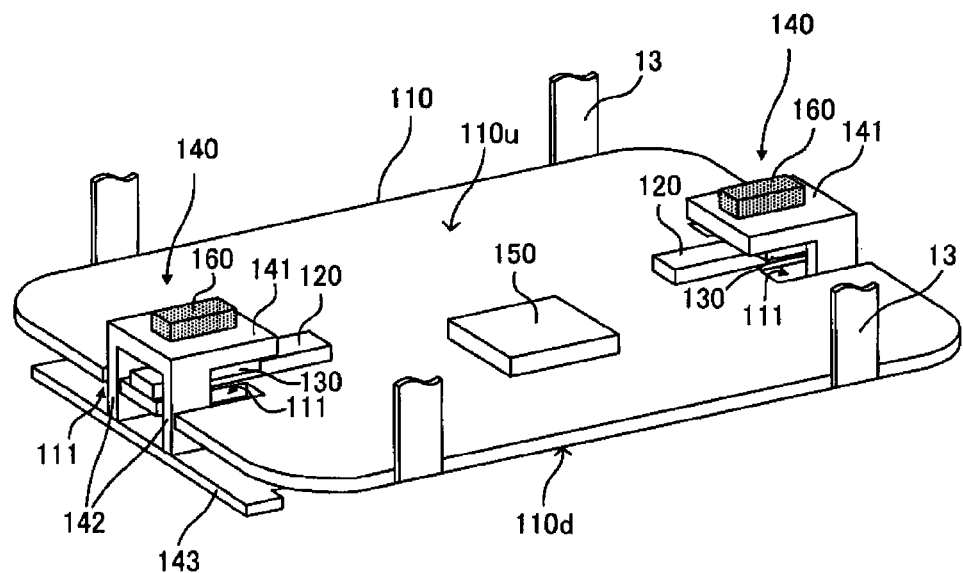
FIG. 8 is a perspective view showing constituent features of the hand section of the overhead hoist transport vehicle according to the second preferred embodiment.
Figure 8:
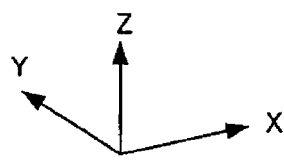

As shown in FIGS. 6 to 8, the hand section 101 includes the base plate 110, the guide rail 120, the pair of guide blocks 130, the pair of chucks 140, the cushion member 160, and the case 190. The guide rail 120 is provided on an upper surface 110u of the base plate 110; the two guide blocks 130 are moveably engaged with the guide rail 120; the two chucks 140 are fixed to the two guide blocks 130; and the case 190 houses these and other components of the hand section 101.

The base plate 110 is a flat plate-shaped member and is raised and lowered when being wound up and down by the hoist section 12. For example, the base plate 110 is connected to the hoist section 12 through the belt 13. The base plate 110 is raised and lowered in a vertical direction (i.e., plumb direction indicated as Z-direction in the figures) when the hoist section 12 winds the belt 13 in and out. As will be explained later, in the second preferred embodiment, a pair of through grooves 111 (see FIG. 8) is provided in the base plate 110 at two sides of the guide rail 120.

The guide rail 120 is provided on the upper surface 110u of the base plate 110. The guide rail 120 is preferably made of, for example, metal, and is arranged such that it extends in one direction (X-direction in the figures) along the upper surface 110u of the base plate 110. The pair of guide blocks 130 (explained later) are moveably engaged with the guide rail 120. The guide rail 120 includes a portion configured to engage with one of the two guide blocks 130 and a portion configured to engage with the other of the two guide blocks 130.

The pair of guide blocks 130 preferably are block-shaped members made of, for example, metal, and are configured to engage moveably with the guide rail 120. The guide blocks 130 are arranged such that they are movable along the guide rail 120 when driven by a drive section 150 (see FIG. 8) that is provided on the upper surface 110u of the base plate 110 and includes, for example, a motor.

Each of the two chucks 140 is fixed onto one of the two guide blocks 130. The pair of chucks 140 can be moved toward and away from each other in a substantially horizontal direction through moving the pair of guide blocks 130 along the guide rail 120. By moving the guide blocks 130 toward each other along the guide rail 120, a gripped state can be achieved in which the flange 910 of the FOUP 900 is gripped by the pair of chucks 140 (i.e., the state shown in FIG. 6). By moving the guide blocks 130 away from each other along the guide rail 120, a released state can be achieved in which the flange 910 of the FOUP 900 is released by the pair of chucks 140 (i.e., the state shown in FIG. 7). Thus, the pair of chucks 140 grips the flange 910 of the FOUP 900 by moving closer together so as to achieve a "closed state" and releases the flange 910 of the FOUP 900 by moving apart so as to achieve an "open state."

Each of the two chucks 140 is fixed to an upper surface 130u of the respective guide block 130 and has a horizontal portion 141 that extends substantially parallel to the upper surface 110u of the base plate 110 and a vertical portion 142 that extends downward from the horizontal portion 141 to a position lower than that of the base plate 110. A claw section 143 is provided on a bottom end of the vertical portion 142 and extends toward the middle of the base plate 110. The pair of chucks 140 can move toward and away from each other in the horizontal direction along the guide rail 120 and grip the FOUP 900 with the claw sections 143. Collectively, the horizontal portions 141, the vertical portions 142, and the claw sections 143 make the pair of chucks 140 generally C-shaped or U-shaped in a cross sectional view. As shown in FIG. 8, the vertical portion 142 of each chuck includes a pair of plate-shaped members that are movable within the pair of through grooves 111 located in the base plate 110 on the two sides of the guide rail 120.

Additionally, with this hand section 101, when the flange 910 of the FOUP 900 is gripped with the pair of chucks 140 and the FOUP 900 is in a suspended state, the falling of the FOUP 900 due to the weight of the FOUP 900 can be reliably prevented. For example, the falling of the FOUP 900 due to detachment of the guide rail 120 from the base plate 110, detachment of a guide block 130 from the guide rail 120, or detachment of a chuck 140 from a guide block 130, can be reliably prevented. As a result, the device may be more fail-safe.

In other words, in the second preferred embodiment, the guide rail 120 and the pair of guide blocks 130 are provided on the upper surface 110u of the base plate 110. Each of the chucks 140 is fixed to the upper surface 130u of one of the guide blocks 130. Therefore, when the flange 910 of the FOUP 900 is gripped with the pair of chucks 140 and the FOUP 900 is in a suspended state, a force corresponding to the weight of the FOUP 900 acts on the upper surface of the guide rail 120 through the chucks 140 and the guide blocks 130 and is transferred through the guide rail 120 to the base plate 110. The force corresponding to the weight of the FOUP 900 acts on the upper surface 130u of the guide blocks 130 through the chucks 140 and is transferred toward the guide rail 120 through the guide blocks 130. As a result, the guide rail 120 can be reliably deterred or prevented from detaching from the base plate 110 and the guide blocks 130 can be reliably deterred or prevented from detaching from be guide rail 120 due to the weight of the FOUP 900. Conversely, if no such countermeasure were adopted, i.e., if the guide rail 120 was fixed to the bottom surface 110d of the base plate 110 and the chucks 140 were fixed to the bottom surfaces of the guide blocks 130 moveably engaged with the guide rails 120, the force corresponding to the weight of the FOUP 900 would act on the guide rail 120 so as to separate the guide rail 120 from the base plate 110. Meanwhile, the force corresponding to the weight of the FOUP 900 would act on the guide blocks 130 so as to separate the guide blocks 130 from the guide rail 120. Consequently, the FOUP 900 would be at risk of falling. The FOUP 900 is particularly likely to fall when the FOUP 900 is heavy and when connections between parts have become weakened, e.g., when screws fixing the guide rail 120 to the base plate 110 have become loose.

Additionally, in the second preferred embodiment, each of the two chucks 140 includes a horizontal portion 141 that is fixed to the upper surface 130u of the respective guide block 130. Therefore, when the flange 910 of the FOUP 900 is gripped with the pair of chucks 140 and the FOUP 900 is in a suspended state, the force corresponding to the weight of the FOUP 900 acts on the horizontal portions 141 through the claw sections 143 and the vertical portions 142 and causes the horizontal portions 141 to be pressed against the guide blocks 130. Thus, the chucks 140 can be deterred or prevented from detaching from the guide blocks 130 due to the weight of the FOUP 900.

The hand section 101 is further provided with a cushion member 160 that includes an elastic member. As shown in FIGS. 6 to 8, in the second preferred embodiment, the cushion member 160 includes a silicone-based gel material and is provided on an upper surface 141u of the horizontal portion 141 of each of the chucks 140.

Figure 9:
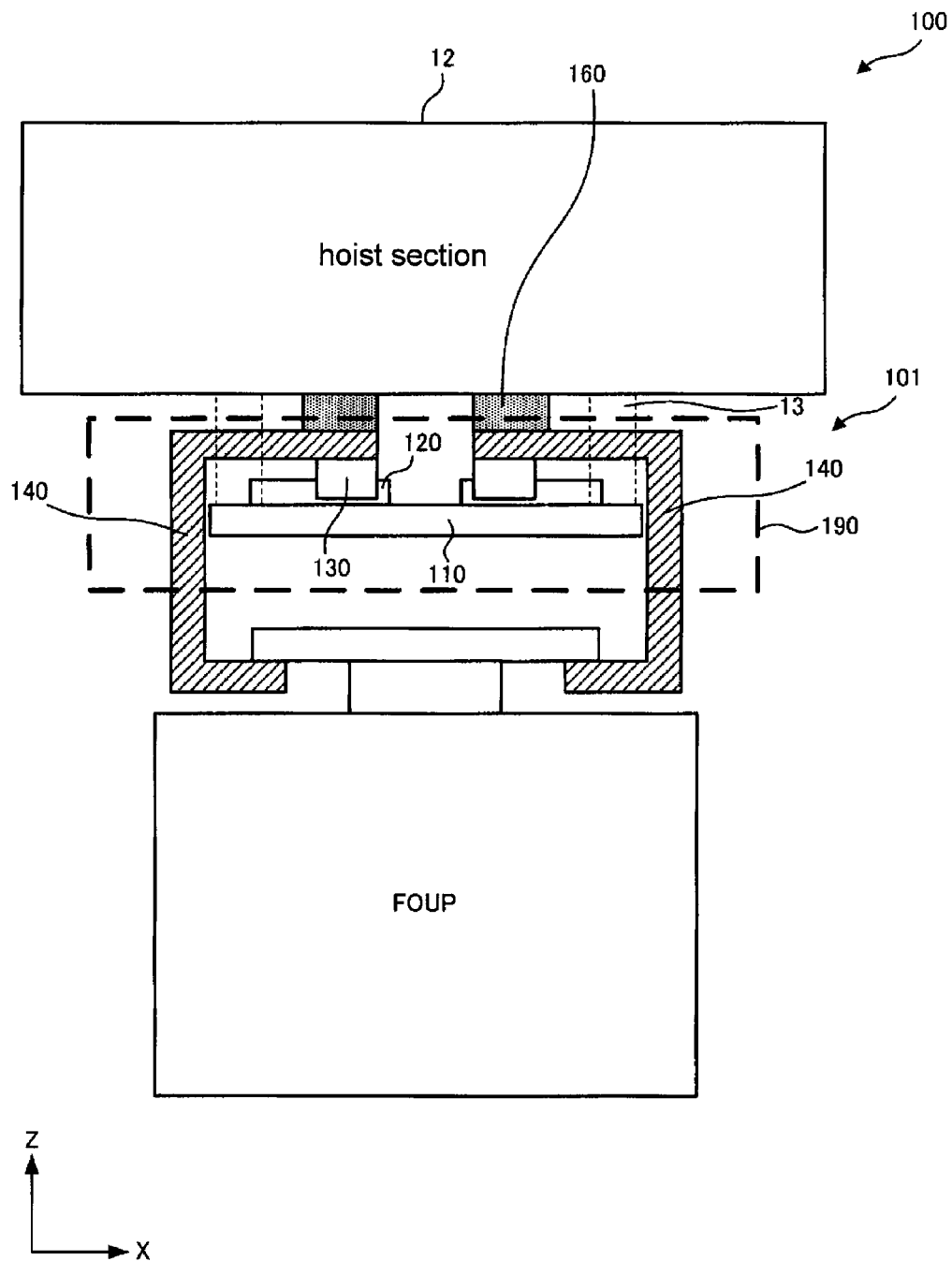
FIG. 9 is a cross sectional view showing a gripper device, according to the second preferred embodiment, gripping a FOUP with a pair of chucks during conveyance.

FIG. 9 is a cross sectional view showing a state of the gripper device 100 when a FOUP 900 is held by the pair of chucks 140 and being conveyed.

As shown in FIG. 9, in the second preferred embodiment, when the hoist section 12 raises the hand section 101, the cushion member 160 contacts and presses against the hoist section 12, and a friction force is generated between the cushion member 160 and the hoist section 12 such that movement of the pair of chucks 140 is restricted.

Thus, when the overhead hoist transport vehicle 10 conveys a FOUP 900, the hoist section 12 moves the base plate 110 upward such that the cushion member 160 is pinched between the horizontal portions 141 of the pair of chucks 140 and a bottom surface of the hoist section 12. In other words, the hoist section 12 moves the base plate 110 upward such that the cushion member 160 is compressed between the horizontal portions 141 of the pair of chucks 140 and the bottom surface of the hoist section 12.

The friction force generated between the cushion member 160 and the hoist 12 reliably prevents the pair of chucks 140 from separating (i.e., prevents the pair of chucks 140 from opening) while the FOUP 900 is being conveyed. As a result, the risk that a separation of the chucks 140 will cause the FOUP 900 to detach from the chucks 140 (more specifically, detach from the claw sections 143 (see FIG. 6)) and fall can be reduced. Also, with the second preferred embodiment, the chucks 140 are prevented from opening merely through the provision of a cushion member 160, and it is not necessary to provide an opening prevention device or other special devices. Consequently, the weight of the hand section 101 does not increase considerably and the structure of the same does not become complex. Moreover, since the cushion member 160 disposed between the hand section 101 and the hoist section 12 includes a gel material, the transfer of vibrations from the hand section 101 to the FOUP 900 during conveyance can be prevented in an effective manner.

Additionally, in the second preferred embodiment, the base plate 110 includes a pair of through grooves 111 that are located on two sides of the guide rail 120 and are configured to extend in the direction in which the guide rail 120 extends. The vertical portion 142 includes a pair of plate-shaped members that are movable within the pair of through grooves 111 along the direction in which the guide rail 120 extends.

Since the vertical portion 142 of each of the chucks 140 includes a pair of plate-shaped members, the chucks 140 can be made smaller and lighter in weight, and the strength of the chucks 140 can be improved.

Additionally, with the second preferred embodiment, the hand section 101 can be made smaller because, as explained previously, the drive section 150 that drives the guide blocks 130 is provided on the upper surface 110u of the base plate 110, similarly to the guide rail 120 and the pair of guide blocks 130.

As explained above, an overhead hoist transport vehicle 100 according to the second preferred embodiment can prevent the pair of chucks 140 from opening while a FOUP 900 is being conveyed with a simple structure.

Also, with the overhead hoist transport vehicle 100, the guide rail 120 is provided on the upper surface 110u of the base plate 110. The pair of chucks 140 includes horizontal portions 141 that are fixed to upper surfaces 130u of the guide blocks 130 that are moveably engaged with the guide rail 120 and arranged to extend in a substantially horizontal direction, and vertical portions 142 that extend downward from the horizontal portions 141 to positions lower than that of the base plate 110, and further includes claw sections 143 provided on lower ends of the vertical portions 142. The cushion member 160 is provided on upper surfaces of the horizontal portions 141.

Thus, when the pair of chucks 140 is raised by the hoist section 12, the cushion member 160 is pinched and compressed between the hoist section 12 and the pair of chucks 140, thereby reliably preventing the pair of clucks 140 from opening.

Additionally, the cushion member 160 includes an elastic member and the elastic member includes a silicone-based gel material.

The silicone-based gel material is extremely pliable and has excellent anti-vibration and damping characteristics. As a result, the pair of chucks can be more effectively prevented from opening and the gripping parts can be more effectively damped against vibration.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead hoist transport vehicle arranged to travel along a path on a ceiling and convey an object, comprising:
    a hand section arranged to grip the object and including:
        a base plate;
        a guide rail provided on the base plate;
        a pair of chuck parts arranged to be movable in a substantially horizontal direction toward and away from each other along the guide rail and including claw sections to grip the object; and
        a cushion member including a pair of elastic members respectively provided on the chuck parts; and
    a hoist section arranged to raise and lower the hand section, wherein
    the elastic members are configured to contact the hoist section and to receive pressure from the hoist section when the hand section is raised such that movement of the chuck parts is restricted through a friction force generated between the chuck parts and the hoist section; and
    the elastic members are configured to separate from the hoist section when the hand section is lowered.

2. The overhead hoist transport vehicle according to claim 1, wherein:
    the hand section further includes a pair of guide blocks moveably provided on the guide rail;
    the guide rail is provided on an upper surface of the base plate;
    the pair of chuck parts each further includes a horizontal portion that is fixed to an upper surface of the guide blocks and extends in a substantially horizontal direction and a vertical portion that extends downward from the horizontal portion to a position lower than that of the base plate, and the claw sections are provided on a lower side of the horizontal portion; and
    the cushion member is provided on an upper surface of the horizontal portion.

3. The overhead hoist transport vehicle according to claim 2, wherein the elastic member includes a silicone-based gel material.

4. The overhead hoist transport vehicle according to claim 3, wherein:
    the base plate includes a pair of through grooves located on two sides of the guide rail and arranged to extend along a direction in which the guide rail extends; and
    the vertical portion includes a pair of plate-shaped members movable within the pair of through grooves along the direction in which the guide rail extends.

5. The overhead hoist transport vehicle according to claim 4, further comprising a drive section provided on the upper surface of the base plate and arranged to drive the guide blocks.

6. The overhead hoist transport vehicle according to claim 3, further comprising a drive section provided on the upper surface of the base plate and arranged to drive the guide blocks.

7. The overhead hoist transport vehicle according to claim 2, wherein:
    the base plate includes a pair of through grooves located on two sides of the guide rail and arranged to extend along a direction in which the guide rail extends; and
    the vertical portion includes a pair of plate-shaped members movable within the pair of through grooves along the direction in which the guide rail extends.

8. The overhead hoist transport vehicle according to claim 7, further comprising a drive section provided on the upper surface of the base plate and arranged to drive the guide blocks.

9. The overhead hoist transport vehicle according to claim 2, further comprising a drive section provided on the upper surface of the base plate and arranged to drive the guide blocks.

10. The overhead hoist transport vehicle according to claim 1, wherein the elastic member includes a silicone-based gel material.

11. The overhead hoist transport vehicle according to claim 10, wherein:
    the base plate includes a pair of through grooves located on two sides of the guide rail and arranged to extend along a direction in which the guide rail extends; and
    the vertical portion includes a pair of plate-shaped members movable within the pair of through grooves along the direction in which the guide rail extends.

12. The overhead hoist transport vehicle according to claim 11, further comprising a drive section provided on the upper surface of the base plate and arranged to drive the guide blocks.

13. The overhead hoist transport vehicle according to claim 10, further comprising a drive section provided on the upper surface of the base plate and arranged to drive the guide blocks.

14. The overhead hoist transport vehicle according to claim 1, wherein:
    the base plate includes a pair of through grooves located on two sides of the guide rail and arranged to extend along a direction in which the guide rail extends; and
    the vertical portion includes a pair of plate-shaped member movable within the pair of through grooves along the direction in which the guide rail extends.

15. The overhead hoist transport vehicle according to claim 14, further comprising a drive section provided on the upper surface of the base plate and arranged to drive the guide blocks.

16. The overhead hoist transport vehicle according to claim 1, wherein:
    each of the pair of chuck parts includes a flat horizontal part, and the hoist section includes a flat horizontal bottom surface; and
    the elastic members are provided on the flat horizontal parts of the chuck parts and are pinched between the flat horizontal parts of the chuck parts and the flat horizontal bottom surface of the hoist section when the hand section is raised.

* * * * *